(12) United States Patent
Kikuchi et al.

(10) Patent No.: US 7,348,673 B2
(45) Date of Patent: Mar. 25, 2008

(54) SEMICONDUCTOR DEVICE

(75) Inventors: Katsumi Kikuchi, Tokyo (JP); Shintaro Yamamichi, Tokyo (JP); Hideya Murai, Tokyo (JP); Hirokazu Honda, Kanagawa (JP); Koji Soejima, Kanagawa (JP); Shinichi Miyazaki, Kanagawa (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 312 days.

(21) Appl. No.: 11/180,729

(22) Filed: Jul. 14, 2005

(65) Prior Publication Data

US 2006/0012029 A1 Jan. 19, 2006

(30) Foreign Application Priority Data

Jul. 15, 2004 (JP) ............................. 2004-208375

(51) Int. Cl.
*H01L 23/48* (2006.01)
(52) U.S. Cl. ................................. 257/758; 257/E33.062
(58) Field of Classification Search ................ 257/758, 257/759, 760, 734, 774, E33.062, E33.066, 257/E31.124, E31.126, 700
See application file for complete search history.

(56) References Cited

U.S. PATENT DOCUMENTS

2004/0164418 A1* 8/2004 Sugiura et al. ............. 257/758

FOREIGN PATENT DOCUMENTS

| JP | H11-074417 A | 3/1999 |
|---|---|---|
| JP | H11-204560 A | 7/1999 |
| JP | 11-219978 A | 8/1999 |
| JP | 2000-150716 A | 5/2000 |
| JP | 2000-323628 A | 11/2000 |
| JP | 2003-204169 A | 7/2003 |
| JP | 2003-338541 A | 11/2003 |

OTHER PUBLICATIONS

K. Kikuchi, et al., "A Package-process-oriented Multilevel 5-um-thick Cu Wiring Technology with Pulse Periodic Reverse Electroplating and Photosensitive Resin," Proceeding of the IEEE 2003 International Interconnect Technology Conference (United States of America), Jun. 2003, p. 189-191.

* cited by examiner

*Primary Examiner*—Howard Weiss
*Assistant Examiner*—(Vikki) Hoa B Trinh
(74) *Attorney, Agent, or Firm*—Sughrue Mion, PLLC

(57) ABSTRACT

A minute wiring structure portion including first wiring layers and first insulating layers, in which each of first wiring layers and each of first insulating layers are alternately laminated, is formed on a semiconductor substrate. A first huge wiring structure portion is formed on the minute wiring structure portion, and the first huge wiring structure portion is formed by successively forming on the minute wiring structure portion, in the following order, the first huge wiring portion including second wiring layers has a thickness of twice or more of the thickness of the first wiring layers and second insulating layers, in which each of second wiring layers and each of second wiring layers are alternately laminated, and a second huge wiring structure portion including third wiring layers has a thickness of twice or more of the thickness of the first wiring layer and a third insulating layer in which the elastic modulus at 25° C. is not more than that of the second insulating layers, each of the third wiring layers and each of the third insulating layers being alternately laminated.

34 Claims, 9 Drawing Sheets

401　　　　　　　　　402

SEMICONDUCTOR DEVICE

BACKGROUND OF THE INVENTION

1. Field of the Invention

The presents invention relates to a semiconductor device having a huge wiring structure portion on a minute wiring structure portion including wiring layers and insulating layers, each of the wiring layers and each of the insulating layers being alternately laminated, the huge wiring structure portion including wiring layers having thicker than the wiring layer of the minute wiring structure portion and insulating layers having thicker than the insulating layer of the minute wiring structure portion, and the wiring layers and the insulating layers of the huge wiring structure portion being alternately laminated.

2. Description of the Related Art

In connection with miniaturization and highly functional design of electronic equipment, miniaturization and high densification of wirings have been recently required of semiconductor chips. For example, in a microprocessor designed on the basis of the 130 nm rule, the clock frequency thereof reaches several GHz and the driving current thereof reaches 100 A, and performance enhancement of the conventional wiring technique is being pushed to the limit. In order to implement a microprocessor having a clock frequency exceeding 10 GHz and a driving current reaching several hundreds A, a wiring technique having a novel structure is required.

For example, K. Kikuchi, et al., "A Package-process-oriented Multilevel 5-μm-thick Cu Wiring Technology with Pulse Periodic Reverse Electroplating and Photosensitive Resin," Proceeding of the IEEE 2003 International Interconnect Technology Conference (United States of America), Jun. 2003, p. 189-191 discloses such a technique that a huge wiring structure portion comprising huge wires formed of copper at a thickness of about 5 μm is provided on a minute wiring structure portion formed of aluminum wires at a thickness of about 0.5 μm. This paper describes that the voltage caused by the drop of a voltage by wire resistance can be reduced to ⅕ as compared with normal LSI wiring.

In semiconductor devices, insulating materials called as low-k materials having a low specific inductive capacity of 2.5 or less are being adopted to implement high-speed operation. Furthermore, in consideration of environmental concerns, Pb-free soldering materials are being adopted as materials of soldering balls. With respect to the semiconductor device provided with the huge wiring structure portion disclosed in the above paper, application of the low-k materials and the Pb-free soldering balls to the semiconductor device has been expected.

However, the low-k materials are lower in mechanical strength such as hardness, elasticity, etc., than silicon oxide, silicon nitride, silicon oxynitride, etc. Furthermore, the Pb-free soldering materials are lower in the creep characteristic indicating ease in deformation of material as compared with conventional Pb-Sn type eutectic soldering materials. Therefore, the deformation amount of the soldering ball itself after solidification is small, and thus the residual stress in the soldering ball is increased.

As described above, with respect to the semiconductor devices using the low-k materials and the Pb-free soldering balls, the residual stress in the soldering balls which occurs in the mounting process and the thermal stress occurring in use cause breaking at the connection portions containing soldering balls or brittle fracture, exfoliation, cracks, etc., of the low-k materials which are weak in mechanical strength, and there is concern that it is difficult to secure reliability when packages are fabricated or semiconductor devices are practically used.

A semiconductor chip is generally used as a semiconductor device (package) while mounted on a print board or a mount board such as a build-up substrate or the like. The semiconductor device is mainly used for FCBGA (Flip Chip Ball Grid Array) packages used in applications which require a stable supply of a power supply voltage and adaptation to high speed signals, and compact electronic equipment such as cellular phones, digital cameras or the like, and wafer level CSP (Chip Size Package) formed in substantially the same size as the semiconductor chip, etc., are known. In these packages, various devices have been made to relieve the thermal stress described above. For example, Japanese Published Unexamined Patent Application No. 74417/1999 discloses an FCBGA package in which a semiconductor chip is connected to a BGA board by soldering bumps and under fill resin is filled between the semiconductor chip and the BGA board to protect minute soldering bump connections.

Furthermore, Japanese Published Unexamjined Patent Application Nos. 204560/1999, 2000-150716 and 2000-323628 discloses wafer level CSP in which a low elasticity layer is provided on a semiconductor chip and an external electrode terminal is provided on the low elasticity layer.

FIG. 1 is a perspective view showing a conventional semiconductor device disclosed in Japanese Published Unexamined Patent Application No. 204560/1999. As shown in FIG. 1, in the semiconductor device disclosed in Japanese Published Unexamined Patent Application No. 204560/1999, a plurality of semiconductor devices (not shown) are formed at the center of the surface of a semiconductor chip 101. Pads 104 are provided on these semiconductor devices. Furthermore, a resin layer 102 formed of insulating material is provided on the surface of the semiconductor chip 101 so as to expose the pads 104 and cover the portion other than the center. Furthermore, a low elasticity layer 103 formed of insulating material having low elasticity is provided on the resin layer 102 so as to expose the pads 104. The low elasticity layer 103 has a wedged sectional shape, which is inclined with respect to the center of the surface of the semiconductor chip 101 on which the pads 104 are disposed. External electrode terminals 106 serving as external electrodes for inputting or outputting signals between the semiconductor chip 101 and external equipment are formed on the flat portion of the low elasticity layer 103, and the external electrode terminals 106 and the pads 104 are connected to one another via wiring layers 105. Protection film 108 is formed on the semiconductor chip except for the external electrode terminals 106. Soldering balls 107 serving as projecting electrodes are provided on the external electrode terminals 106. As described above, by providing the low elasticity layer 103 at the lower side of the soldering balls 107, the stress imposed on the soldering balls 107 can be relieved. Furthermore, the soldering balls 107 are provided on the surface of the semiconductor chip 101 so as to be spaced from the pads at a large distance, whereby the stress occurring in the soldering balls 107 can be prevented from being transmitted to the semiconductor device connected to the pads 104.

FIG. 2 is a cross-sectional view showing a conventional semiconductor device disclosed in Japanese Published Unexamined Patent Application No. 2000-150716. As shown in FIG. 2, in the semiconductor device disclosed in Japanese Published Unexamined Patent Application No. 2000-150716, connection terminals 202 are provided on the surface of the semiconductor chip 201. Furthermore, a resin layer 203 and a low elasticity layer 204 are provided at the portions other than the connection terminals 202 on the surface of the semiconductor chip 201. Soldering balls 206 are provided via a wiring layer 205 on the resin layer 203. The wiring layer 205 is connected to the connection terminals 202. The low elasticity layer 204 is formed only at the lower side of the surrounding portion of each soldering ball 206. By providing the low elasticity layer at the lower side of the periphery of each soldering ball as described above, the stress occurring in the soldering ball can be relieved.

Furthermore, FIG. 3 is a cross-sectional view showing a conventional semiconductor device disclosed in Japanese Published Unexamined Patent Application No. 2000-323628. As shown in FIG. 3, in the semiconductor device disclosed in Japanese Published Unexamined Patent Application No. 2000-323628, an electrode 302 is provided on the surface of a semiconductor chip 301. Passivation film 303 is provided so as to cover the semiconductor chip 301 except for the electrode 302, and a resin layer 304 is provided on the passivation film 303. A soldering ball 307 is provided via a wiring layer 306 on the resin layer 304. The electrode 302 is connected to the wiring layer 306. Furthermore, a resin layer 305 is formed so as to cover the surfaces of the resin layer 304 and the wiring layer 306 and the side surface of the lower portion of the soldering ball 307. According to Japanese Published Unexamined Patent Application No. 2000-323628, low elasticity material is used as the resin layer 305 covering the side surface of the soldering ball, so that the stress occurring in the soldering ball can be relieved.

Furthermore, Japanese Published Unexamined Patent Application No. 2003-204169 discloses a technique that a member having flexibility which is obtained by laminating a high elasticity layer and a low elasticity layer is used as a multilayered wiring plate on which a semiconductor chip is mounted. According to this technique, the wires of the multilayered wiring plate and via-holes can be made to be difficult to damage by the thermal stress in use.

Still furthermore, FIG. 4 is a plan view showing another conventional semiconductor device. In the conventional semiconductor device shown in FIG. 4, a plurality of circular external terminals 402 are arranged in a matrix form on a surface layer 401. These external terminals 402 are provided in conformity with high-density minute wires, and the size and pitch of the external terminals 402 are minute.

However, the above conventional techniques have the following problems. In the technique disclosed in Japanese Published Unexamined Patent Application No. 74417/1999, the rigidity of the soldering ball connection portions is enhanced by using the under fill resin, thereby preventing the breaking of the soldering ball connection portions. Therefore, in the semiconductor device provided with the huge wiring structure portion, stress which is not relieved propagates through huge wires serving as rigid bodies and concentrates on the minute wiring structure portion, which may cause breaking of minute wires, breakdown or exfoliation of the insulating film formed of the low-k material, etc.

In the technique disclosed in Japanese Published Unexamined Patent Application No. 204560/1999, the soldering balls are provided so as to be spaced from the pads at a large distance in order to prevent the stress occurring in the soldering balls from propagating to the semiconductor device connected to the pads, and thus an extra space is required to be provided on the surface of the semiconductor chip. In a flip chip mounting semiconductor chip whose number of terminals is increased, it is difficult to secure a space for keeping the soldering balls spaced from the pads and a space for drawing a wiring pattern therefore.

Furthermore, in the technique disclosed in Japanese Published Unexamined Patent Application No. 2000-150716, the low elasticity resin is provided at the lower side of the soldering ball connection portion. However, this low elasticity resin is constrained by the surrounding high elasticity resin, and thus it is impossible to deform the low elasticity resin to the extent that the stress can be relieved, so that the stress relieving is insufficient. Therefore, the stress propagates through the huge wires serving as the rigid bodies and concentrates on the minute wiring structure portion, which may cause breaking of the minute wires, the breakdown or exfoliation of the insulating film formed of the low-k material, etc.

Still furthermore, in the technique disclosed in Japanese Published Unexamined Patent Application No. 2000-323628, the low elasticity resin is provided at the side surface of the soldering ball and the deformation of the soldering ball is promoted to relieve the stress. However, as in the case of the Japanese Published Unexamined Patent Application No. 2000-150716, the stress relieving is insufficient, which causes breaking of the minute wires, breakdown or exfoliation of the insulating film formed of the low-k material, etc.

Still furthermore, in the technique disclosed in Japanese Published Unexamined Patent Application No. 2003-204169, the reliability of the multilayered wiring plate on which the semiconductor chip is mounted is enhanced, however, it is difficult to relieve the stress occurring at the semiconductor chip side.

In the conventional semiconductor device shown in FIG. 4, the size and pitch of the external terminals on the mounting surface are minute, and thus the connection area between the semiconductor device and the mount board when the semiconductor device is mounted on the mount board is small, and thus the connection reliability is lowered.

SUMMARY OF THE INVENTION

An object of the present invention is to provide a highly reliable semiconductor device that is provided with a huge wiring structure portion on a minute wiring structure portion, relieving stress occurring in the minute wiring structure portion, has large driving current and operates at high frequency.

According to the present invention, there is provided a semiconductor device comprising: a semiconductor substrate; a minute wiring structure portion provided on the semiconductor substrate and including one or more first wiring layers and one or more first insulating layers, in which each of the first wiring layers and each of the first insulating layers are alternately laminated, and each of the first wiring layers has one or more first wires and a first insulating film for insulating the first wire; a first huge wiring structure portion that is provided on the minute wiring structure portion and including one or more second wiring layers and one or more second insulating layers, in which each of the second wiring layers and each of the second insulating layers are alternately laminated, each of the second wiring layers has a thickness which is twice or more the thickness of the first wiring layer and has one or more second wires and a second insulating film for insulating the second wire, and each of the second insulating layers is thicker than the first insulating layer; a second huge wiring structure portion provided on the first huge wiring structure portion and including one or more third wiring-layers and one or more third insulating layers, in which each of the third wiring layers and each of the third insulating layers are alternately laminated, each of the third wiring layers has a thickness which is twice or more the thickness of the first wiring layer and has one or more third wires and a third insulating film for insulating the third wires, and each of the third insulating layers is thicker than the first insulating layer and has the elastic modulus at 25° C. not more than the elastic modulus at 25° C. of the second insulating layer.

In the present invention, the first huge wiring structure portion in which the second wiring layer has a thickness of twice or more of the thickness of the first wiring layer and the second insulating layer are alternately laminated is provided on the minute wiring structure portion which is provided on the semiconductor substrate and in which the first wiring layer and the first insulating layer are alternately laminated, and further the second huge wiring structure portion in which the third wiring layer has a thickness of twice or more of the thickness of the first wiring layer and the third insulating layer has the elastic modulus at 25° C. which is not more than that of the second insulating layer are alternately laminated is provided on the first huge wiring structure portion. Therefore, the stress occurring in the semiconductor device after the semiconductor device is mounted on the mount board can be effectively relieved in the first huge wiring structure portion and the second huge wiring structure portion, and the stress imposed on the minute wiring structure portion can be reduced.

The third insulating layer may be designed so that the elastic modulus at 25° C. thereof is set to 0.15 to 3 GPa.

Furthermore, the elastic modulus at 25° C. may be set to be smaller than the elastic modulus at 25° C. of the first insulating layer.

Still furthermore, the tensile elongation of the third insulating layer may be set to 15% or more.

Still furthermore, the second insulating layer and the third insulating layer may be formed of the same material.

Still furthermore, the second wire may be formed of at least one kind of metal or alloy selected from the group consisting of copper, aluminum, nickel, gold and silver.

Still furthermore, one or plural external terminals electrically connected to the third wire may be provided on the second huge wiring structure portion. In this case, the surfaces of the external terminals may be formed of at least one kind of metal or alloy selected from the group consisting of copper, aluminum, gold, silver and soldering material.

Still furthermore, each of the first wiring layer, the second wiring layer and the third wiring layer has a plurality of power source system wires, and one wire of the plural power source system wires of the second wiring layer or the third wiring layer may be electrically connected to two or more power source system wires of the plural power source system wires of the first wiring layer. In this case, one wire of the plural power source system wires of the third wiring layer may be electrically connected to two or more power source system wires of the plural power source system wires of the second wiring layer. As described above, in the second wiring layer and/or the third wiring layer having a larger permissible current amount than the first wiring layer, two or more power source system wires using the same voltage are integrated into one wire, whereby the number of external terminals provided on the second huge wiring structure portion with respect to the number of connection terminals on the minute wiring structure portion can be reduced. Accordingly, the size and pitch of the external terminals can be increased and the packaging reliability can be enhanced.

Still furthermore, each of the first wiring layer, the second wiring layer and the third wiring layer may have plural ground system wires, and one wire of the plural ground system wires of the second wiring layer or the third wiring layer may be electrically connected to two or more ground system wires of the plural ground system wires of the first wiring layer. In this case, one wire of the plural ground system wires of the third wiring layer may be electrically connected to two or more ground system wires of the plural ground system wires of the second wiring layer. As described above, in the second wiring layer and/or the third wiring layer having a larger permissible current amount than the first wiring layer, two or more ground system wires using the same voltage are integrated into one wire, whereby the number of external terminals provided on the second huge wiring structure portion with respect to the number of connection terminals on the minute wiring structure portion can be reduced. Therefore, the size and pitch of the external terminals can be increased and the packaging reliability can be enhanced.

Each of the first wiring layer, the second wiring layer and the third wiring layer may have plural power source system wires and plural ground system wires, one wire of the plural power source system wires of the third wiring layer or the second wiring layer may be electrically connected to two or more power source system wires of the plural power source system wires of the first wiring layer, and one wire of the plural ground system wires of the third wiring layer and the second wiring layer may be electrically connected to two or more ground system wires of the plural ground system wires of the first wiring layer. In this case, one wire of the plural power source system wires of the third wiring layer may be electrically connected to two or more power source system wires of the plural power source system wires of the second wiring layer, and one wire of the plural ground system wires of the third wiring layer may be electrically connected to two or more ground system wires of the plural ground system wires of the second wiring layer. As described above, in the second wiring layer and/or the third wiring layer having a permissible current amount larger than the first wiring layer, two or more power system wires using the same voltage can be integrated into one wire, and also two or more ground system wires using the same voltage are integrated into one wire, whereby the number of external terminals provided on the second huge wiring structure portion with respect to the number of connection terminals on the minute wiring structure portion can be effectively reduced, so that the size and pitch of the external terminals can be increased and thus the packaging reliability can be enhanced.

According to the present invention, the first huge wiring structure portion in which the second wiring layer(s) having a thickness of twice or more of the thickness of the first wiring layer and the second insulating layer(s) are alternately laminated is provided on the minute wiring structure portion in which the first wiring layer(s) and the first insulating layer(s) are alternately laminated, and the second huge wiring structure portion in which the third wiring layer(s) having a thickness of twice or more of the thickness of the first wiring layer(s) and the third insulating layer(s) having the elastic modulus at 25° C. which is not more than that of the second insulating layer are alternately laminated is provided on the first huge wiring structure portion, whereby the stress occurring after the semiconductor device is mounted on the mount board can be effectively relieved by the first huge wiring structure portion and the second huge wiring structure portion, and thus the stress imposed on the minute wiring structure portion can be reduced. Furthermore, the plural power source system wires and/or the ground system wires are integrated, whereby the number of external terminals can be reduced and the number of external terminals and/or the pitch can be increased. As a result, there can be provided a highly reliable semiconductor device having a large driving current and operating at a high frequency.

DETAILED DESCRIPTION OF THE PREFERRED EMBODIMENTS

Figure 5:
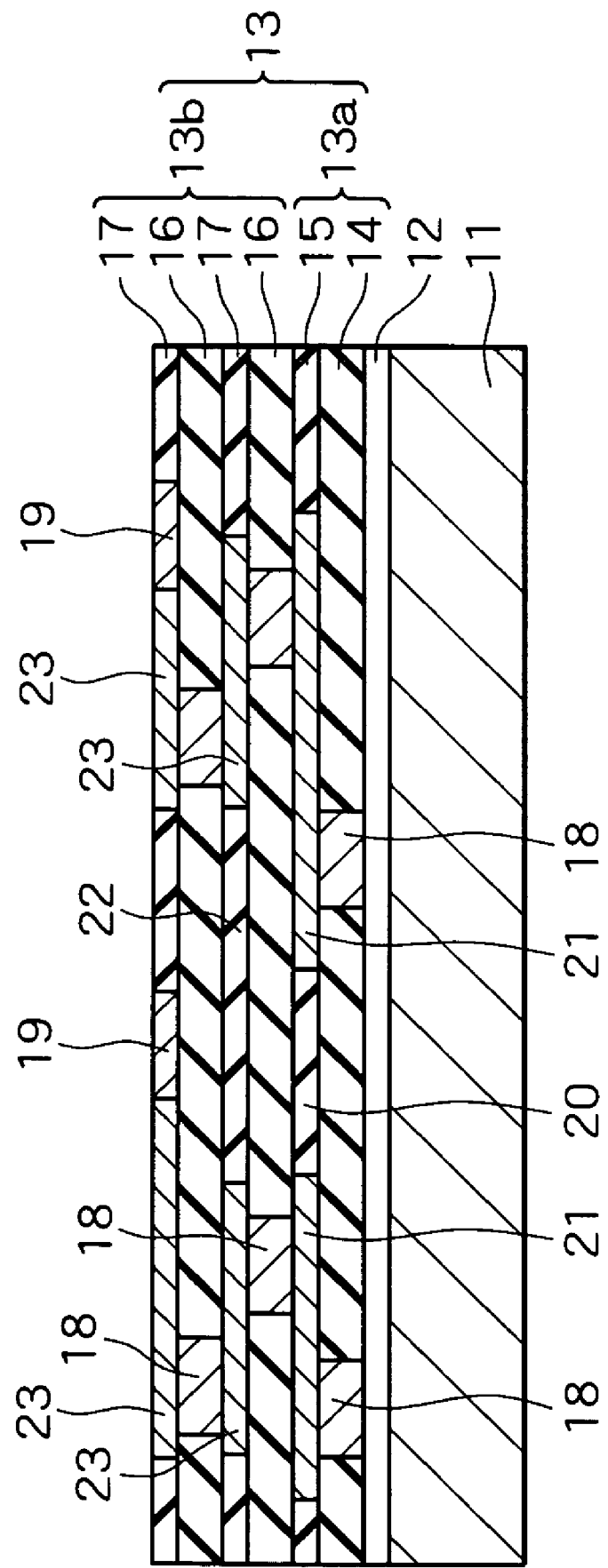
FIG. 5 is a cross-sectional view showing a semiconductor device according to a first embodiment of the present invention.
Figure 6:
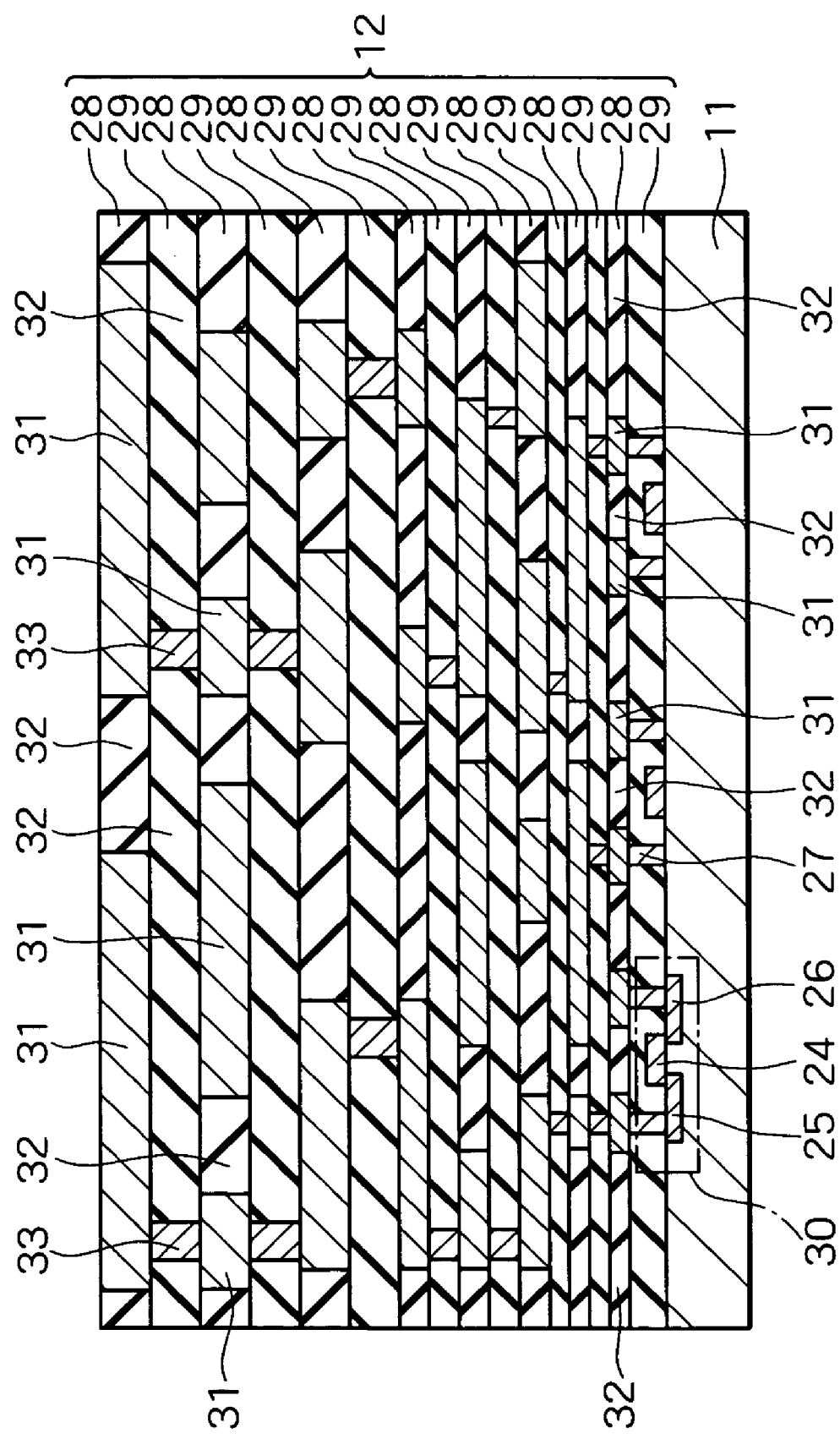
FIG. 6 is an enlarged cross-sectional view showing the construction of a minute wiring structure portion 12 in a semiconductor device shown in FIG. 5.
Figure 7:
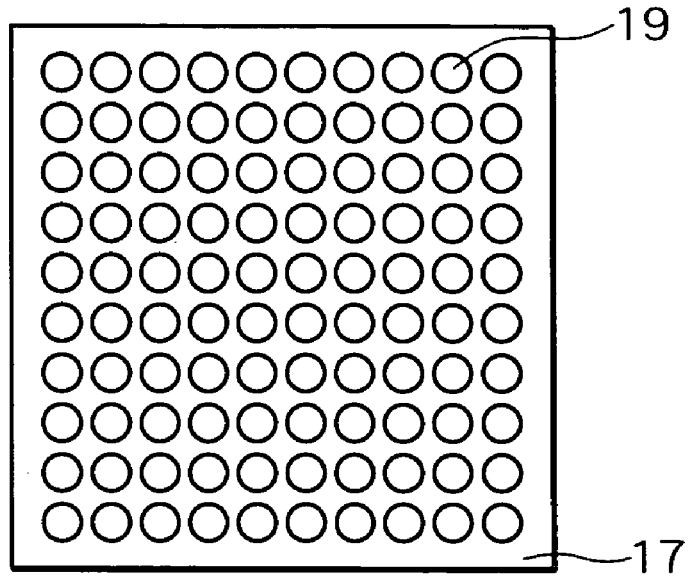
FIG. 7 is a plan view showing an arrangement of external terminals of the semiconductor device shown in FIG. 5.

Preferred embodiments according to the present invention will be described with reference to the accompanying drawings. First, a semiconductor device according to a first embodiment of the present invention will be described. FIG. 5 is a cross-sectional view showing the semiconductor device according to the first embodiment of the present invention, and FIG. 6 is an enlarged cross-sectional view showing the construction of a minute wiring structure portion 12 in the semiconductor device shown in FIG. 5. Furthermore, FIG. 7 is a plan view showing the semiconductor device shown in FIG. 5. As shown in FIG. 5, in the semiconductor device of this embodiment, a minute wiring structure portion 12 is formed on the surface of a semiconductor substrate 11 formed of Si, GaAs or the like, and a huge wiring structure portion 13 including a huge wiring portion 13a and a huge wiring portion 13b which are successively laminated in this order is formed on the minute wiring structure portion 12.

Furthermore, as shown in FIG. 6, a source electrode 25 and a drain electrode 26 are formed on the surface of the semiconductor substrate 11 so as to be spaced from each other, and a gate electrode 24 is formed via gate insulating film (not shown) on the area sandwiched between the source electrode 25 and the drain electrode 26. A MOS (Metal Oxide Semiconductor) transistor 30 is constructed by the gate electrode 24, the source electrode 25 and the drain electrode 26. Plural MOS transistors 30 as described above are provided on the semiconductor substrate 11.

As shown in FIG. 6, the minute wiring structure portion of the semiconductor device of this embodiment 12 are obtained by alternately laminating insulating layers 29 and wiring layers 28. Specifically, an insulating layer 29 is formed so as to cover the MOS transistor 30 and a surface of the semiconductor substrate 11, and a wiring layer 28 is formed on the insulating layer 29. The wiring layer 28 comprises plural wires 31 and insulating film 32 for insulating the wires 31 from one another. The wire 31 is electrically connected to the source electrode 25 and the drain electrode 26 by a plug 27 formed in the insulating layer 29. Plural pairs of insulating layers 29 and wiring layers 28 are further alternately laminated on the above wiring layer 28 as the lowermost layer. A via 33 is formed in each insulating layer 29 to mutually connect each wire 31 of the wiring layer 28 provided on the insulating layer 29 concerned to each wire 31 of the wiring layer provided beneath the insulating layer 29 concerned, and the wires 31 of the different wiring layers 28 are electrically connected to one another by this via 33.

Furthermore, the thickness of the insulating layer 29 is set to 0.2 to 1.2 μm, for example. At least one insulating layer 29 provided near the semiconductor substrate 11 among the plural insulating layers 29 is desired to be formed of a low-k (low dielectric constant) material. Porous silicon oxide film may be used as the low-k material constituting the insulating layer 29, for example. The elasticity at 25° C. of the insulating layer 29 is equal to 4 to 10 GPa.

The minute wiring structure portion 12 may be formed by a damascene method. According to the damascene method, after a groove (trench) having a desired wiring pattern shape or a desired via pattern shape is formed on insulating film by dry etching, a barrier metal layer is formed by the sputtering method, the CVD (Chemical Vapor Deposition) method, ALD (Atomic Layer Deposition) method or the like. Subsequently, a feeder layer for electrolytic plating is formed by the sputtering method or the like, the groove (trench) is embedded with copper by the electrolytic plating, and then desired wires are obtained with copper remaining only in the groove (trench) by the CMP (Chemical Mechanical Polishing) method.

Furthermore, as shown in FIG. 5 and FIG. 6, a huge wiring portion 13a including an insulating layer 14 and a wiring layer 15 which are laminated in this order is provided on the minute wiring structure portion 12. The wiring layer 15 of the huge wiring portion 13a having a plurality of wires 21 and insulating film 20 for insulating the wires 21 from one another. Vias 18 are provided in each insulating layer 14 so as to mutually connect the wires 21 of the wiring layer 15 provided on the insulating layer 14 and the wires 31 formed in uppermost layer of the minute wiring structure portion 12. In the semiconductor device of this embodiment, the huge wiring portion 13a is constructed by a pair of an insulating layer 14 and a wiring layer 15, however, the present invention is not limited to this structure. For example, plural insulating layers 14 and plural wiring layers 15 may be alternately laminated, and wires 21 provided in wiring layers 15 provided at the upper and lower sides of each insulating layer 14 may be mutually connected to one another by vias 18 provided in the insulating layer 14.

A huge wiring portion 13b is further provided on the huge wiring portion 13a. The huge wiring portion 13b having a plurality of insulating layers 16 and a plurality of wiring layers 17 which are alternately laminated (in the figure, two pairs). Each of the wiring layers 17 of the huge wiring portion 13b having a plurality of wires 23 and insulating film 22 for mutually insulating the wires 23 from one another. In the insulating layer 16 are formed vias 18 for mutually connecting the wires 23 of the wiring layer 17 provided above the insulating layer 16 to the wires 23 of the wiring layer 17 provided below the insulating layer 16. Accordingly, the wires 23 of the different wiring layers 17 are electrically connected to one another by the vias 18.

Furthermore, the thickness of the wiring layer 15 of the huge wiring portion 13a and the thickness of the wiring layer 17 of the huge wiring portion 13b are set to be twice or more the thickness of the wiring layer 28 of the minute wiring structure portion 12. Specifically, the thickness of each of the wiring layers 15 and 17 is set in the range from 3 to 12 µm, and preferably in the range from 5 to 10 µm. When the thickness of each of the wiring layers 15 and 17 is set to less than 3 µm, the wiring resistance is increased, and thus the electrical characteristic of the semiconductor device may be deteriorated. On the other hand, when the thickness of each of the wiring layers 15 and 17 exceeds 12 µm, it may be difficult to form the wiring layer because of some restriction on the process. Furthermore when the thickness of each of the wiring layers 15 and 17 is less than 5 µm, the wiring layers 15 and 17 are liable to be broken, and when the thickness exceeds 10 µm, the overall thickness of the huge wiring structure portion 13 is increased and thus the board may be warped by the internal stress thereof.

The wires 21 of the wiring layer 15 and the wires 23 of the wiring layer 17 may be formed of at least one kind of metal selected from the group consisting of copper, aluminum, nickel, gold and silver. Out of these metal materials, copper is particularly suitable from the viewpoint of electrical resistance value and cost, and in this case, the thickness of each of the wiring layers 15 and 17 is set to 5 µm, for example. When the wires 21 and 23 are formed of nickel, the interface reaction with another material such as insulating material or the like can be prevented, and these wires can be used as inductor or resistance wires by actively using the characteristic as magnetic material.

The wires 21 and the wires 23 are formed by a method such as a subtractive method, a semi-additive method, a full-additive method or the like which is different from the wire forming method of the minute wiring structure portion 12. According to the subtractive method, a resist pattern is formed on copper foil provided on a substrate formed of ceramics, resin or the like, and then the resist pattern is exfoliated to obtain a desired wiring pattern. According to the semi-additive method, a feeder layer is formed by electroless plating, the sputtering method, the CVD method or the like, and then a resist pattern is formed so as to be opened in a desired pattern. Thereafter, metal is deposited in the opening of the resist by electrolytic plating method, the resist pattern is removed, and then the feeder layer is etched to obtain a desired wiring pattern. According to the full-additive method, a catalyst for electroless plating is adsorbed onto a substrate formed of ceramics, resin or the like, and then a resist pattern is formed. The catalyst is activated with the resist pattern being left as insulating film, and metal is deposited in the opening of the insulating film (the resist pattern) by the electroless plating method to obtain a desired wiring pattern.

Furthermore, it is desirable that the elastic modulus of the insulating layer 16 of the huge wiring portion 13b is set to 0.15 to 3 GPa at 25° C., and this elastic modulus at 25° C. is lower than that of the insulating layer 14 of the huge wiring portion 13a. When the elastic modulus of the insulating layer 16 is less than 0.15 GPa, the deformation amount of the insulating layer 16 when the stress is relieved is large, and most of the stress is applied to the wiring layer 17. Therefore, breaking of the wires 23 and breakdown at the interface between the wire 23 and the via 18 or between the wire 21 and the via 18 is liable to occur. On the other hand, when the elastic modulus of the insulating layer 16 exceeds 3 GPa, the deformation of the insulating layer 16 is insufficient, and the stress relieving in the huge wiring portions 13a and 13b is insufficient, so that the interlayer exfoliation, the breakdown of the insulating film, etc., are liable to occur in the minute wiring structure portion 12.

Figure 1:
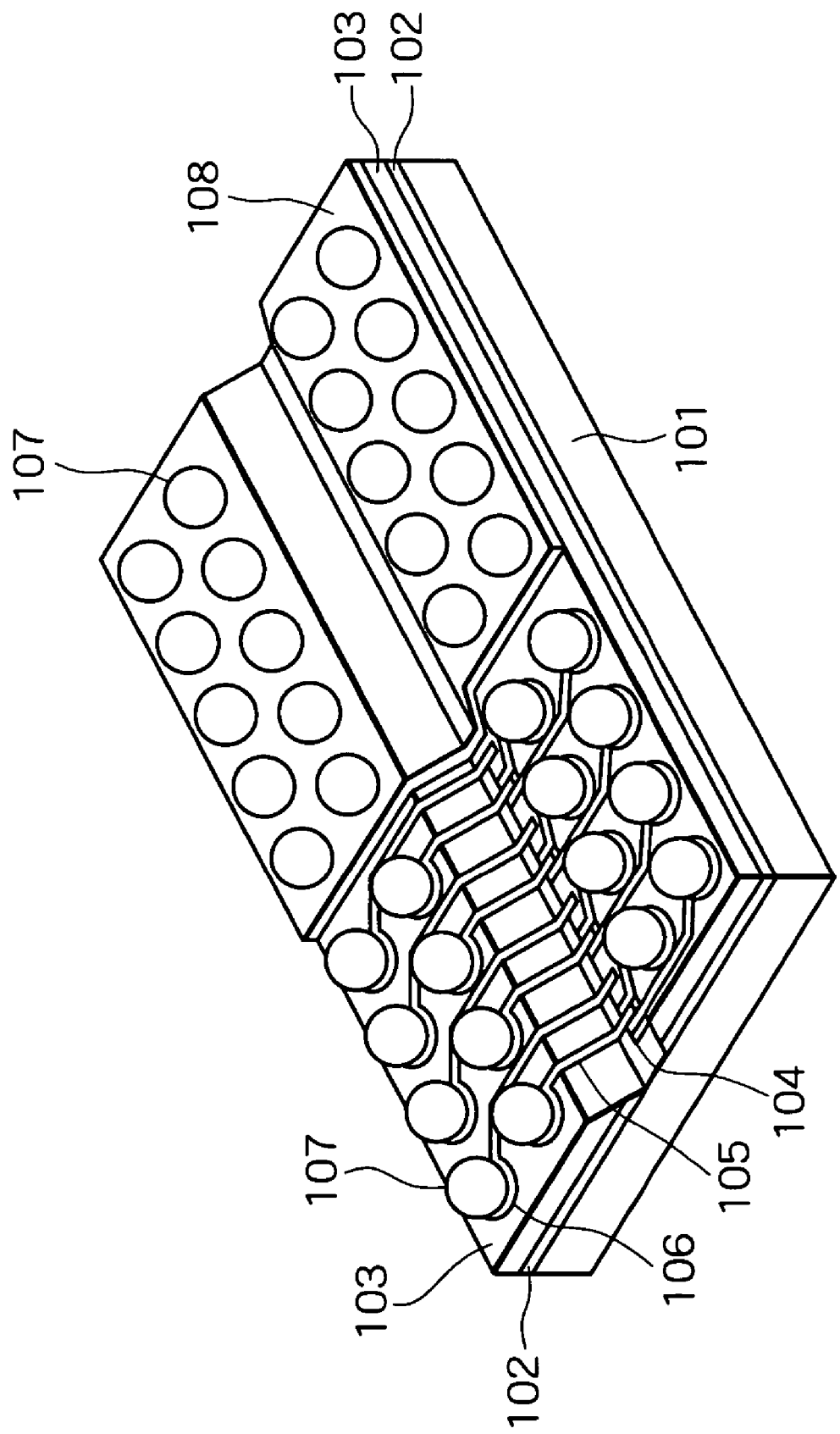
FIG. 1 is a perspective view showing a conventional semiconductor device disclosed in Japanese Published Unexamined Patent Application No. 204560/1999.
Figure 2:
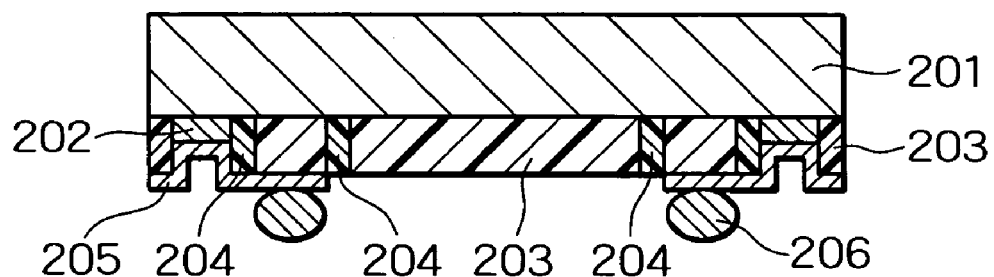
FIG. 2 is a cross-sectional view showing a conventional semiconductor device disclosed in Japanese Published Unexamined Patent Application No. 2000-150716.
Figure 3:
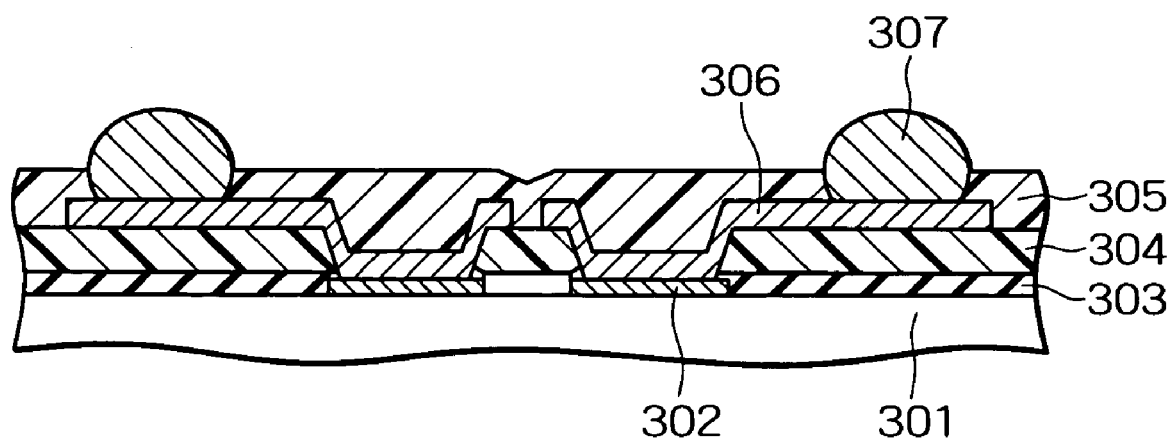
FIG. 3 is a cross-sectional view showing a conventional semiconductor device disclosed in Japanese Published Unexamined Patent Application No. 2000-323628.
Figure 4:
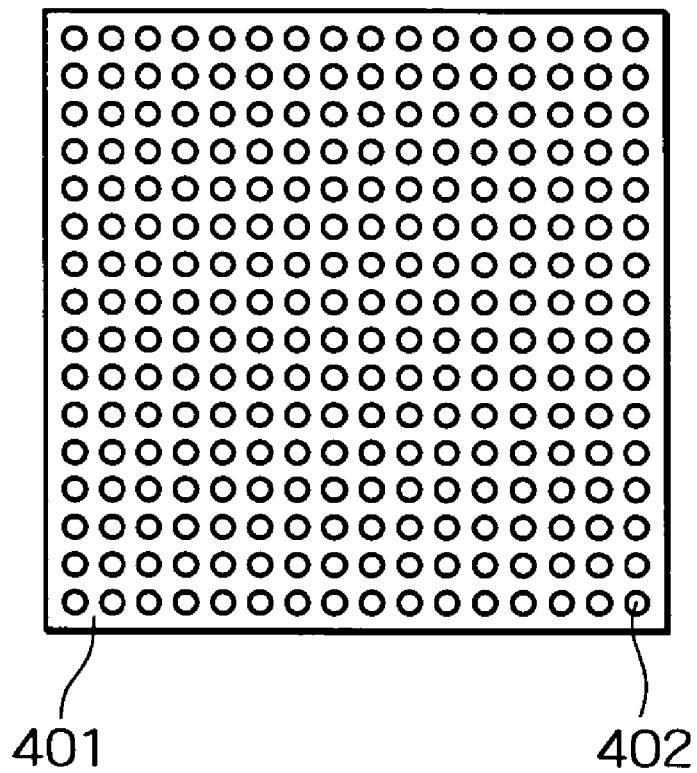
FIG. 4 is a plan view showing another conventional semiconductor device.

Furthermore, as shown in FIG. 6 and FIG. 7, in the semiconductor device of this embodiment, external terminals 19 which are electrically connected to the wires 23 are provided in a matrix arrangement in the wiring layer 17 formed at the uppermost layer of the huge wiring portion 13b. These external terminals 19 are obtained by laminating a plurality of layers, for example. In this case, in consideration of wettability of soldering balls or connectivity to bonding wires, the surface of the external terminals 19, that is, the uppermost layer is preferably formed of at least one kind of metal or alloy selected from the group consisting of copper, aluminum, gold, silver and soldering material. When the external terminals 19 are formed by laminating a gold layer on a copper layer, the thickness of the gold layer is set to 1 µm, for example. In the semiconductor device of this embodiment, the size and pitch of the external terminals 19 are larger as compared with the conventional semiconductor device shown in FIG. 4.

With respect to the semiconductor device, the stress applied to the external terminals 19 when the semiconductor device is mounted on the mount board is relieved mainly by deformation of the insulating layer 16 and the insulating film 22 of the huge wiring portion 13b. On the other hand, the stress that is not relieved in the huge wiring portion 13b propagates through the wires 23 and the vias 18 to the huge wiring portion 13a. However, in the semiconductor device of this embodiment, the insulating layer 14 of the huge wiring portion 13a is higher in the elastic modulus at 25° C. than the insulating layer 16 of the huge wiring portion 13b, and thus the stress applied to the huge wiring portion 13a is dispersed to the wiring layer 15 and the insulating layer 14 of the huge wiring portion 13a. As a result, the stress can be prevented from concentrating on only the wires 21 having high rigidity, and the insulating layer 14 and the insulating film 20 are deformed, so that the stress can be further relieved.

In the semiconductor device of this embodiment, when the routing length of the electrical connecting portion between the huge wiring structure portion 13 and the minute wiring structure portion 12, that is, the wire between the via 18 of the insulating layer 14 and the external terminal 19 is sufficiently long, the stress occurring in the semiconductor device after the semiconductor device is mounted on the mount board can be sufficiently attenuated in the respective wiring layers provided in the huge wiring structure portion 13. Furthermore, when the thickness of the insulating layers 14 and 16 of the huge wiring structure portion 13 is sufficiently thick, the stress applied when the semiconductor device is mounted on the mount board can be sufficiently relieved by the insulating layers 14 and 16. Accordingly, in such a case, the elastic modulus of 25° C. of the insulating layer 16 may be set to be equal to that of the wiring layer 14.

With respect to the elastic modulus at 25° C. of each of the insulating film 32 of the wiring layer 28 provided in the minute wiring structure portion 12, the insulating film 20 of the wiring layer provided in the huge wiring portion 13a and the insulating film 22 of the wiring layer 17 provided in the huge wiring portion 13b, for example, the elastic modulus at 25° C. of the insulating film 32 is set to the highest value, and the elastic modulus at 25° C. of the insulating film 22 is set to not more than that of the insulating film 20 (insulating film 22 ≦ insulating film 20 < insulating film 32). Accordingly, the stress relieving effect by the first huge wiring structure portion 13 can be enhanced.

Furthermore, the tensile elongation of the insulating layer 14 and the insulating layer 16 is set to 15% or more, for example. When the tensile elongation is less than 15%, a crack is liable to occur in the insulating layer 14 and/or the insulating layer 16. For example, when the semiconductor device of this embodiment is mounted on the mount board and a temperature cycle test from −40 to 125° C. is carried out, a crack occurs in the insulating layer 14 or the insulating layer 16 by 100 to 300 cycles. Accordingly, it is desirable that the tensile elongation is set to 15% or more.

Still furthermore, the insulating layer 14 and the insulating layer 16 are formed of photosensitive or non-photosensitive organic material, and for example, they may be formed of epoxy resin, epoxy acrylate resin, urethane acrylate resin, polyester resin, phenol resin, polyimide resin, BCB (benzocyclobutene), PBO (polybenzoxazole), polynorbornene resin or the like. Particularly polyimide resin and PBO out of these organic materials are excellent in mechanical characteristics such as film strength, tensile elasticity, tensile elongation, etc., and thus high reliability can be obtained. When photosensitive organic material is used, openings are formed in the insulating layer 14 and the insulating layer 16 by photolithography, and vias 18 are formed in the openings. On the other hand, when non-photosensitive organic material or photosensitive organic material having low pattern resolution is used, openings are formed in the insulating layer 14 and the insulating layer 16 by a laser beam machining method, a dry etching method or a blasting method, and vias 18 are formed in the openings. Furthermore, plating posts are formed at the positions of vias 18 in advance, and after the insulating layer 14 or the insulating layer 16 is formed, the surface of the insulating layer 14 or the insulating layer 16 is ground by polishing to expose the posts, thereby forming the vias 18. In this case, it is unnecessary to form openings in the insulating layer 14 and the insulating layer 16 in advance.

Furthermore, with respect to the insulating layer 14 and the insulating layer 16, when the elastic modulus at 25° C. is not less than 1.5 GPa, the thermal expansivity is not more than 40 ppm/° C. When the thermal expansivity exceeds 40 ppm/° C., inner stress of the insulating layer 14 or the insulating layer 16 may cause warp in a wafer in which the semiconductor device is formed. When the total thickness of the respective insulating layers is equal to about 30 to 35 μm in a silicon wafer having a diameter of 200 mm (8 inches) and a thickness of 0.725 mm, a warp amount exceeds 200 μm and this causes a problem in the subsequent chip forming process using dicing. However, by setting the thermal expansivity of the insulating layer 14 and the insulating layer 16 to not more than 20 ppm/° C., the warp amount of the chip can be reduced, and the thickness of each insulating layer can be increased. Furthermore, when the total thickness of the insulating layers is equal to about 30 to 35 μm, if the elastic modulus at 25° C. of the insulating layer 14 and the insulating layer 16 is less than 1.5 GPa, the warp of a wafer is less than 200 μm irrespective of the value of the thermal expansivity.

As described above, according to the semiconductor device of this embodiment, the elastic modulus at 25° C. of the insulating layer 16 of the huge wiring portion 13b is set to not more than the elastic modulus at 25° C. of the insulating layer 14 of the huge wiring portion 13a, and also the thickness of the wiring layer 15 and the wiring layer 17 is set to twice or more of the wiring layer 28 of the minute wiring structure portion 12. Therefore, when soldering balls are provided to the external terminals 19 and the semiconductor device is mounted on the mount board, the stress applied to the semiconductor device due to mismatch of the thermal expansivity between the mount board and the semiconductor device or the like can be relieved by deformation of the wiring layer 16 of the huge wiring portion 13b having low elasticity.

Furthermore, the stress propagating through the wires is attenuated in the wires 23 of the huge wiring portion 13b, and further attenuated in the insulating layers 14 and 15 of the huge wiring portion 13a, so that the stress is relieved. Further, the thickness of the wiring layer 15 and the wiring layer 17 of the huge wiring structure portion 13 is set to twice or more of the thickness of the wiring layer 28 of the minute wiring structure portion 12. Therefore, the wiring layers 15 and 17 can be prevented from being broken down by the deformation of the insulating layers 14 and 16, and also the wiring resistance of the wires 21 and 23 can be reduced. When the thickness of the wiring layers 15 and 17 is less than twice that of the thickness of the wiring layer 28, the wiring layers 15 and 17 are easily broken down, and also the wire resistance is increased. Furthermore, when the thickness of the wiring layers 15 and 17 is increased, the thickness per layer of the insulating layers 14 and 16 is also increased in connection with the increase of the thickness of the wiring layers 15 and 17, so that the stress relieving effect can be enhanced. Accordingly, the propagation of the stress to the minute wiring structure portion 12 can be effectively reduced, and a semiconductor device having high reliability when the semiconductor device is mounted on a mount board can be implemented. Accordingly, there can be provided a highly reliable semiconductor device that has a large driving current and operates at a high frequency.

Furthermore, the thickness of each of the wiring layers 15 and 17 is set to twice or more of the thickness of the wiring layer 28 of the minute wiring structure portion 12, and thus the permissible current amount in the wires 21 and 23 of the huge wiring structure portion 13 is equal to at least twice or more of the permissible current amount of the wires 31 of the minute wiring structure portion. Therefore, in the wiring layers 15 and 17 of the huge wiring structure portion 13, two or more power source system wires which use the same voltage can be integrated into one wire, and also two or more ground system wires can be integrated into one wire.

In the semiconductor device such as wafer level CSP or the like in which rewiring is carried out on a semiconductor element, the number of connection terminals provided on the conventional semiconductor element has one-to-one correspondence to the number of external terminals on the re-wiring, and only the arrangement thereof is changed. When the number of external terminals of the semiconductor element is equal to 500 or more, the rate of the power source system and ground terminals to the total terminal number starts to increase, and when the number of external terminals is equal to 1500 or more, about 60 to 80% of the total number of terminals are set as the terminals of the power source system and the ground system in order to keep the performance of the semiconductor element. In the semiconductor device of this embodiment, two or more power source system wires or two or more ground wires are integrated into one wire, whereby the number of external terminals provided on the connection terminals on the minute wiring structure portion 12 can be reduced with respect to the number of connection terminals. Accordingly, as shown in FIG. 7, as compared with the conventional semiconductor device shown in FIG. 4, the size and interval (pitch) of the external terminals 19 can be increased, and the connection area between the semiconductor device and the mount board in the mounting process can be increased, and high connection reliability can be implemented with high yield.

Furthermore, the number of external terminals 19 is small, and thus the degree of freedom of the arrangement of the external terminals is high. Therefore, in small amount and various kinds of packages such as FCBGA, the arrangement of the terminals of the power source system, the ground system and the signal system among different types of goods can be made common. Therefore, a common board on which connection terminals of a power source system, a ground system and a signal system are arranged at determined places in advance can be used, and thus the cost can be effectively reduced.

In the semiconductor device of this embodiment, the huge wiring portion 13a is equipped with one insulating layer 14 and one wiring layer 15, and the huge wiring portion 13b is equipped with two insulating layers 14 and two wiring layers 17. However, the present invention is not limited to this embodiment, and one or more insulating layers and one or more wiring layers may be alternately laminated in both the huge wiring portions 13a and 13b. Therefore, the number of insulating layers and the number of wiring layers in the huge wiring portions 13a and 13b may be set so that each of the number of insulating layers 14 and the number of wiring layers 15 are set to 2 and each of the number of insulating layers 16 and the number of wiring layers 17 is set to 2, and various combinations in number may be considered.

Figure 8:
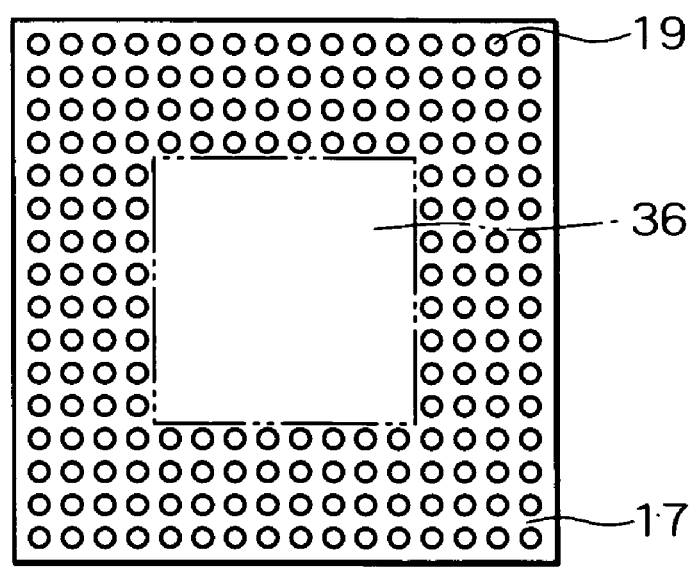
FIG. 8 is a plan view showing a semiconductor device of a first modification of the first embodiment of the present invention.

Next, a semiconductor device according to a first modification of the first embodiment of the present invention will be described. FIG. 8 is a plan view showing the semiconductor device of this modification. In the semiconductor device of the first embodiment shown in FIG. 7, the external terminals 19 are provided in a matrix arrangement in the wiring layer 17, and the size and pitch thereof are set to be larger than those of the conventional semiconductor device shown in FIG. 4. On the other hand, as shown in FIG. 8, in the semiconductor device of this modification, the external terminals 19 are provided in a matrix arrangement in the area excluding a rectangular area (empty area 36) at the center of the wiring layer 17, and the size and pitch thereof are the same as the size and pitch of the external terminals of the conventional semiconductor device shown in FIG. 4. The construction other than the above construction in the semiconductor device of this modification is the same as the semiconductor device of the first embodiment.

In the semiconductor device of this modification, the external terminals 19 are provided in a matrix arrangement in the area excluding the empty area 36 at the center of the wiring layer 17, and thus other passive elements, active elements or optical elements can be mounted in the empty area 36, and multifunction and high-performance design of semiconductor devices can be implemented. Furthermore, in the semiconductor device of this modification, the two or more power source system wires or two or more ground wires are integrated into one wire, whereby the number of external terminals provided on connection terminals on the minute wiring structure portion 12 can be reduced with respect to the number of connection terminals.

Furthermore, in the semiconductor device of this modification, the area for providing necessary external terminals can be secured, and also the empty area 36 can be provided. Therefore, when another element is mounted, a desired external terminal may be provided in the empty area 36. The operation and effect other than the operation and effect of the semiconductor device of this modification are the same as the semiconductor device of the first embodiment described above.

Figure 9:
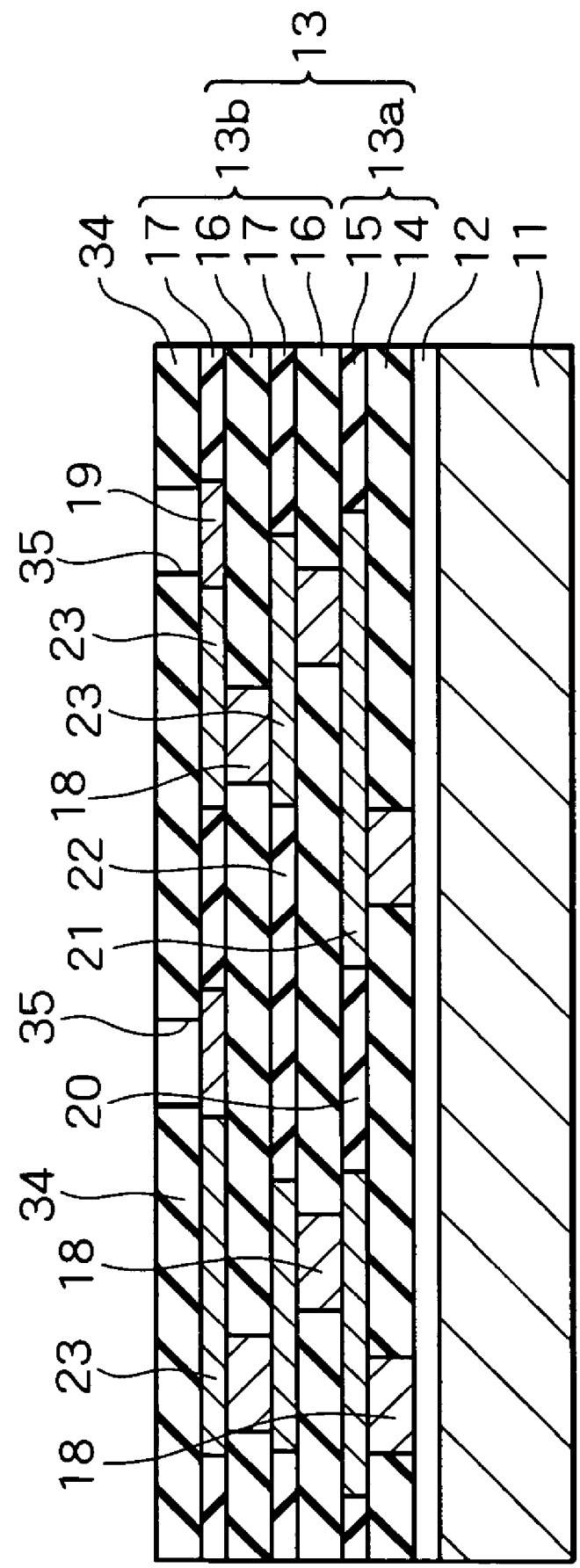
FIG. 9 is a cross-sectional view showing a semiconductor device according to a second modification of the first embodiment of the present invention.

Next, a semiconductor device according to a second modification of the first embodiment of the present invention will be described. FIG. 9 is a cross-sectional view showing the semiconductor device according to this modification. In the semiconductor device of the first embodiment described above, the external terminals 19 are provided in the wiring layer 17 serving as the uppermost layer. However, in the semiconductor device of this modification, as shown in FIG. 9, an insulating layer 34 is provided on the wiring layer 17, and openings 35 are formed in the insulating layer 34 so that at least a part of each external terminal 19 is exposed. The insulating layer 34 protects the wiring layer 17 serving as the uppermost layer, and also serves as a solder resist for preventing soldering balls provided on the external terminals 19 from flowing along the surfaces of the wires 23 of the wiring layer 17 during a reflow step (solder melting). The construction, operation and effect other than that of the semiconductor device of this modification are the same as the semiconductor device of the first embodiment described above.

Figure 10:
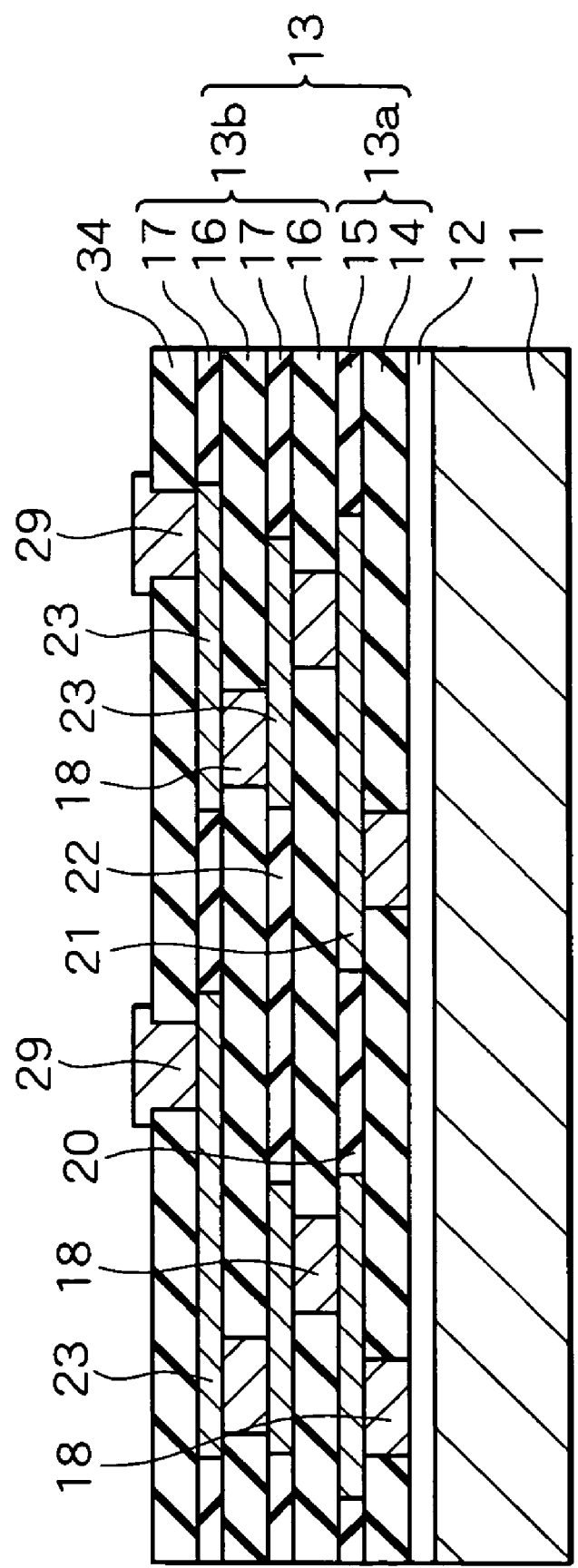
FIG. 10 is a cross-sectional view showing a semiconductor device according to a third modification of the first embodiment of the present invention.

Next, a semiconductor device according to a third modification of the first embodiment of the present invention will be described. FIG. 10 is a cross-sectional view showing the semiconductor device of this modification. As shown in FIG. 10, in the semiconductor device of this modification, the insulating layer 34 is provided so as to cover the wiring layer 17. Openings are formed in the insulating layer 34 so that the wires 23 are partially exposed, and the external terminals 29 are provided in the openings. The insulating layer 34 protects the wiring layer 17 and serves as solder resist for preventing solder balls provided on the external terminals 19 from flowing along the surface of the wiring layer 17.

In FIG. 10, the external terminals 29 are embedded in the openings of the insulating layer 34, and the surfaces thereof are flattened. However, the present invention is not limited to this embodiment, and the external terminals 29 may be provided in a shape which is conforms with the shape of the openings of the insulating layer 34. Furthermore, the construction, operation and effect other than that of the semiconductor device of this modification are the same as the semiconductor device of the first embodiment described above.

In the semiconductor device of each embodiment described above, a capacitor serving as a noise filter for a circuit may be provided at a desired position of a laminate circuit constructed by the surface of the minute wiring structure portion 12, the insulating layer 14, the wiring layer 15, the insulating layer 16, the wiring layer 17, the external terminals 19 and the insulating layer 34. As dielectric material constituting the capacitor metal oxide such as titanium oxide, tantalum oxide, $Al_2O_3$, $ZrO_2$, $HfO_2$, $Nb_2O_5$ or the like, perovskite-based material such as BST ($Ba_xSr_{1-x}TiO_3$), PZT ($PbZr_xTi_{1-x}O_3$), PLZT ($Pb_{1-y}La_yZr_xTi_{1-x}O_3$) or the like, or Bi-based laminar compound such as SrBi$_2$Ta$_2$O$_9$ or the like may be preferably used. In this case, $0 \leq x \leq 1$, $0 < y < 1$. Furthermore, organic material mixed with inorganic material or magnetic material may be used as dielectric material constituting the capacitor.

Furthermore, one or plural insulating layers 14 and one or plural insulating layers 16 of the huge wiring structure portion 13 are formed of material whose dielectric constant is equal to 9 or more, and circuit electrodes are formed at desired positions of the upper and lower wiring layers with respect to each of the above insulating layers so that the capacitor serves as a noise filter for the circuit. As the dielectric material constituting the capacitor metal oxide such as Al$_2$O$_3$, ZrO$_2$, HfO$_2$, Nb$_2$O$_5$ or the like, perovskite-based material such as BST, PZT, PLZT or the like, Bi-based laminar compound such as SrBi$_2$Ta$_2$O$_9$ or the like may be preferably used. Furthermore, organic material mixed with inorganic material or magnetic material may be used as dielectric material constituting the capacitor.

Figure 11:
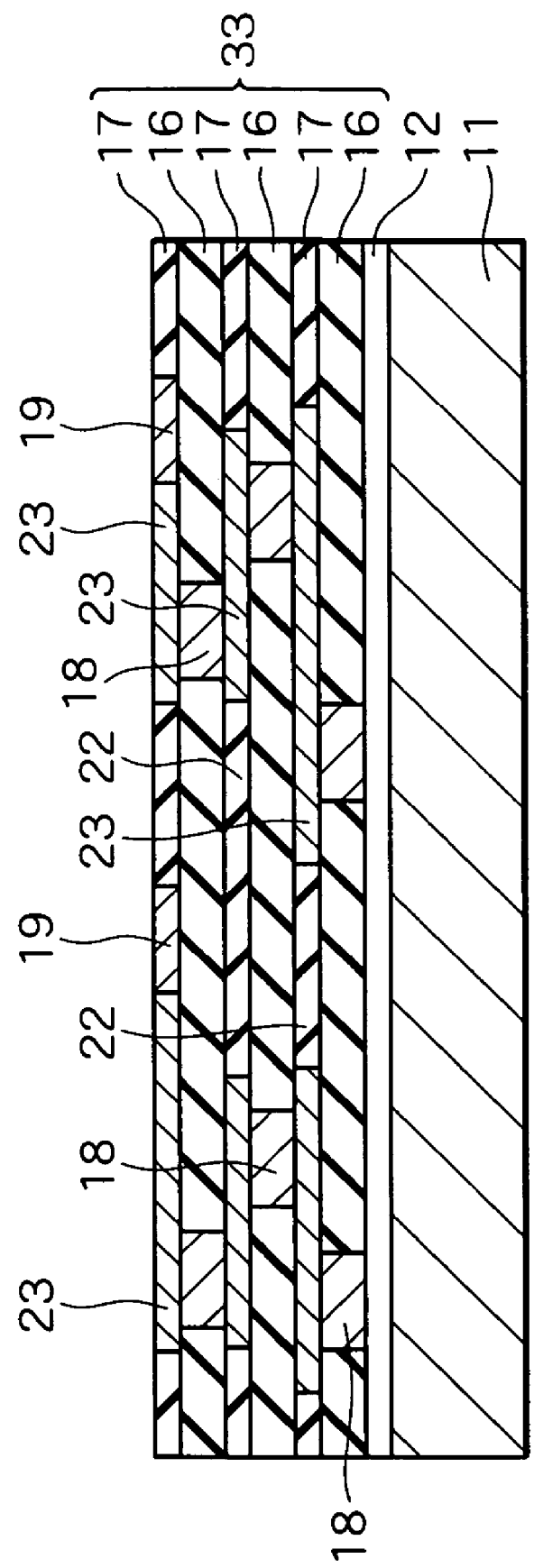
FIG. 11 is a cross-sectional view showing a semiconductor device according to a second embodiment of the present invention.

Next, a semiconductor device according to a second embodiment will be described. FIG. 11 is a cross-sectional view showing the semiconductor device of this embodiment. In the semiconductor device of the first embodiment shown in FIG. 5 and FIG. 6, the huge wiring portion 13a including the insulating layer 14 and the wiring layer 15 which are alternately laminated is provided on the minute wiring structure portion 12, and the huge wiring portion 13b including the insulating layers 16 and the wiring layers 17 which are alternately laminated is provided on the huge wiring portion 13a. The insulating layer 16 is formed of material having lower elastic modulus at 25° C. than the insulating layer 14. That is, the huge wiring structure portion 13 comprises the two huge wiring layers 13a and 13b between which the material of the insulating layer is different. On the other hand, in the semiconductor device of this embodiment, all the insulating layers 16 which are provided in the huge wiring structure portion 33 are formed of the same material. That is, the insulating layers 16 and the wiring layers 17 are alternately laminated on the minute wiring structure portion 12 to construct the huge wiring layer 33. Furthermore, the wiring layer 17 comprises the wires 23 and the insulating film 22. Furthermore, each insulating layer 16 is provided with vias 18 for mutually connecting the wires 23 formed at the upper and lower wiring layers 17. The construction of the minute wiring structure portion 12 is the same as the semiconductor device of the first embodiment shown in FIG. 6.

In the semiconductor device of this embodiment, the insulating layer 16 is formed of material having a lower elastic modulus at 25° C. than that of the insulating layer 29 of the minute wiring structure portion 12. The elastic modulus at 25° C. of the insulating layer 16 is set to 0.15 to 3 GPa, for example. When the elastic modulus is less than 0.15 GPa, the deformation amount of the insulating layers 16 when the stress is relieved is large, and most of the stress propagates to the wiring layers 17, so that the breaking of the wires 23 of the wiring layers 17 and the breakdown at the interface of the multilayered wires are liable to occur. On the other hand, when the elastic modulus exceeds 3 GPa, the deformation of the insulating layers 16 is small, and thus the stress relieving in the huge wiring structure portion 13 is insufficient, so that the interlayer exfoliation, the insulating film breakdown, etc., are liable to occur in the minute wiring structure portion 12. Furthermore, the tensile elongation of the insulating layers 16 is set to 15% or more, for example. When the tensile elongation is less than 15, crack is liable to occur in the insulating layer 16.

Furthermore, the insulating layers 16 are formed of organic material, for example, and for example, epoxy resin, epoxy acrylate resin, urethane acrylate resin, polyester resin, phenol resin, polyimide resin, BCB, PBO, polynorbornene resin or the like may be used. Particularly, polyimide resin and PBO out of these organic materials are excellent in mechanical characteristics such as film strength, tensile elasticity, tensile elongation, etc., and high-reliability can be obtained. When photosensitive organic material is used, openings are formed in the insulating layer 14 and the insulating layers 16 are formed by photolithography, and vias 18 are formed in the openings. On the other hand, when non-photosensitive organic material or photosensitive organic material having low pattern resolution is used, openings are formed in the insulating layer 14 and the insulating layers 16 by the laser beam machining method, the dry etching method or the blasting method, and vias 18 are formed in the opening. Furthermore, plating posts are formed at the positions of vias 18 in advance, and after the insulating layer 14 or the insulating layer 16 is formed, the surface of the insulating layer 14 or the insulating layer 16 is ground by polishing to expose the plating posts, thereby forming the vias 18. In this case, it is unnecessary to form openings in the insulating layer 14 and the insulating layer 16 in advance. The construction other than the above construction of the semiconductor device of this embodiment is the same as the semiconductor device of the first embodiment.

In the semiconductor device of this embodiment, unlike the semiconductor device of the first embodiment as described above, the huge wiring structure portion 33 is constructed by the insulating layers 16 and the wiring layers 17, and all the insulating layers are formed of the same material, so that the cost can be more greatly reduced as compared with the case where plural kinds of materials are used. Furthermore, the insulating layer 16 is set to be smaller in the elastic modulus at 25° C. than that of the insulating layer 29 of the minute wiring structure portion 12, and thus the thermal stress is relieved by deformation of the insulating layers 16. Furthermore, the stress propagating through the wires is attenuated in the wiring layers 17, so that the propagation of the stress to the minute wiring structure portion 12 can be effectively reduced, and a highly reliable semiconductor device when the semiconductor device is mounted can be implemented.

The semiconductor device of this embodiment can also be designed in the same construction as the semiconductor devices of the first to third modifications of the first embodiment. Furthermore, in the semiconductor device of this embodiment, a capacitor serving as a noise filter for a circuit may be provided at a desired position of a laminate circuit constructed by the surface of the minute wiring structure portion 12, the insulating layer 16, the wiring layer 17, the external terminals 19 and the insulating layer 34. Furthermore, the operation and effect other than the operation and effect of the semiconductor device of this embodiment are the same as the semiconductor device of the first embodiment described above.

Next, the effect of examples of the present invention will be described by comparing it with comparison examples out of the range of this invention. In this example, the semiconductor devices, which have the same construction as the first or the second embodiment of the present invention, were estimated on the basis of a single package temperature cycle test (−40° C., 30 minutes/+125° C., 30 minutes) by using FCBGA package. The estimating method of the FCBGA package was performed by electrically connecting the semiconductor device to the mount board and measuring the resistance values of the wires by which the mount board and the semiconductor device are connected to each other while a BGA terminal provided on a surface of the mount board on which the semiconductor device is not mounted is set as a measuring point. The temperature cycle test adopted a success condition under which the variation rate of the resistance value at a measuring place is within ±10% until 1000 cycles.

The FCBG packages used for the test had the following structure. That is, the semiconductor device of the first and second embodiments was subjected to flip-chip mounting on the mount board, stiffner (reinforcing plate) formed of copper was adhesively attached to the surface of the mount board at the outside of the semiconductor device, and a heat spreader (heat radiation plate) formed of copper was joined to the upper portions of the stiffner and the semiconductor device. As the semiconductor device a TEG (Test Element Group) chip was used having an overall size of 17 mm×17 mm and external terminals of about 4000 in number. Furthermore, a build-up board having an overall size of 50 mm×50 mm and a thickness of 1.2 mm was used as the mount board on which the semiconductor device was mounted. The external terminals 19 were designed in a circular shape of 100 μm in diameter and arranged at an interval (pitch) of 200 μm, and lead-free solder (produced by Senju Metal Industry; M705) was used for the flip-chip connection.

With respect to the semiconductor device of the first embodiment, semiconductor devices No. 1 to No. 17 were manufactured while the huge wiring portion 13a was designed so that one insulating layer 14 and one wiring layer 15 are alternately laminated, the huge wiring structure portion 13b was designed so that two insulating layers 16 and two wiring layers 17 were alternately laminated, and the materials of the insulating layers 14 and 16 and the insulating film 20 and 22 of the huge wiring structure portion 13 were changed. The thickness of the insulating layer 14 and the insulating layer 16 was set to 8 μm, and the thickness of the wiring layer 15 and the wiring layer 17 was set to 5 μm.

With respect to the semiconductor device of the second embodiment, semiconductor devices No. 18 to No. 28 were manufactured while the huge wiring structure portion 33 was designed so that three insulating layers 16 and three wiring layers were alternately laminated, and the material of the insulating layer 16 was changed. The thickness of the insulating layer 16 was set to 8 μm, and the thickness of the wiring layer 17 was set to 5 μm.

The wires of the huge wiring structure portion in each semiconductor device were formed by electrolytic copper plating according to the semi-additive method using sputter film as a feeder layer. Furthermore, when photosensitive material is used as insulating film, the via 18 was formed in the opening of the insulating film formed according to the photolithography method by plating simultaneously with the wiring layer. When non-photosensitive material is used as the insulating film, the post was formed at the via-forming position by plating, and after the insulating film was formed polishing exposed the post.

Furthermore, in the minute wiring structure portion 12, porous silicon oxide film was used for the insulating film of the insulating layer and the wiring layer from the second layer wire to the fifth layer wire which were counted from the MOS transistor side, and silicon oxynitride was used for the insulating film of the insulating layer and the wiring layer of the sixth layer wire to the seventh layer wire. The damacine method was used as the wire forming method of the minute wiring structure portion 12.

The physical properties of the insulating film formed in each semiconductor device are shown in the following Table 1. Estimation results of the respective semiconductor devices are shown in the following Tables 2 and 3. The number of semiconductor devices to be subjected to the test was equal to 22 for each level, and conduction states at four places were estimated for each package. The temperature cycle test results indicated by the following Tables 2 and 3 were cycle numbers for which the conduction resistance during the test was measured on a real-time basis and a resistance value out of the success condition was confirmed at 88 measurement points of each level.

TABLE 1

| INSULATING FILM | ELASTIC MODULUS (GPa) | TENSILE FILM STRENGTH (MPa) | TENSIL ELONGATION (%) | THERMAL EXPANSIVITY (ppm/° C.) |
| --- | --- | --- | --- | --- |
| A | 0.12 | 10 | 24 | 250 |
| B | 0.2 | 14 | 21 | 197 |
| C | 0.3 | 29 | 47 | 130 |
| D | 0.52 | 42 | 57 | 130 |
| E | 1.5 | 85 | 17 | 40 |
| F | 2.5 | 122 | 23 | 39 |
| G | 2.8 | 148 | 56 | 31 |
| H | 3.0 | 130 | 40 | 36 |
| I | 3.2 | 140 | 30 | 50 |
| J | 4.7 | 226 | 55 | 17 |
| K | 7.9 | 220 | 15 | 10 |

TABLE 2

| | No. | STRUCTURE | INSULATING LAYER 14 | INSULATING LAYER 16 | TEMPERATURE CYCLE TEST RESULT | JUDGMENT |
| --- | --- | --- | --- | --- | --- | --- |
| COMPARATIVE EXAMPLES | 1 | FIRST EMBODIMENT | C | A | 528 CYCLES VIA IN INSULATING LAYER 16 OPEN | NG |
| | 2 | FIRST EMBODIMENT | G | A | 533 CYCLES VIA IN INSULATING LAYER 16 OPEN | NG |
| | 3 | FIRST EMBODIMENT | H | A | 516 CYCLES VIA IN INSULATING LAYER 16 OPEN | NG |

TABLE 2-continued

| | No. | STRUCTURE | INSULATING LAYER 14 | INSULATING LAYER 16 | TEMPERATURE CYCLE TEST RESULT | JUDGMENT |
|---|---|---|---|---|---|---|
| EXAMPLES | 4 | FIRST EMBODIMENT | I | A | 524 CYCLES VIA IN INSULATING LAYER 16 OPEN | NG |
| | 5 | FIRST EMBODIMENT | C | B | 1023 CYCLES VIA IN INSULATING LAYER 16 OPEN | PASS |
| | 6 | FIRST EMBODIMENT | G | B | 1066 CYCLES VIA IN INSULATING LAYER 16 OPEN | PASS |
| | 7 | FIRST EMBODIMENT | H | B | 1108 CYCLES VIA IN INSULATING LAYER 16 OPEN | PASS |
| | 8 | FIRST EMBODIMENT | E | C | 1255 CYCLES VIA IN INSULATING LAYER 16 OPEN | PASS |
| | 9 | FIRST EMBODIMENT | F | D | 1443 CYCLES VIA IN INSULATING LAYER 16 OPEN | PASS |
| | 10 | FIRST EMBODIMENT | G | D | 1588 CYCLES VIA IN INSULATING LAYER 16 OPEN | PASS |
| | 11 | FIRST EMBODIMENT | J | D | 1172 CYCLES VIA IN INSULATING LAYER 16 OPEN | PASS |
| | 12 | FIRST EMBODIMENT | I | E | 1438 CYCLES VIA IN INSULATING LAYER 16 OPEN | PASS |
| | 13 | FIRST EMBODIMENT | J | G | 1357 CYCLES FLIP CHIP CONNECTION SOLDER OPEN | PASS |
| | 14 | FIRST EMBODIMENT | K | G | 1221 CYCLES FLIP CHIP CONNECTION SOLDER OPEN | PASS |
| COMPARATIVE EXAMPLES | 15 | FIRST EMBODIMENT | J | I | 872 CYCLES FLIP CHIP CONNECTION SOLDER OPEN | NG |
| | 16 | FIRST EMBODIMENT | K | I | 824 CYCLES FLIP CHIP CONNECTION SOLDER OPEN | NG |
| | 17 | FIRST EMBODIMENT | K | J | 647 CYCLES FLIP CHIP CONNECTION SOLDER OPEN | NG |

TABLE 3

| | No. | STRUCTURE | INSULATING LAYER 16 | TEMPERATURE CYCLE TEST RESULT | JUDGMENT |
|---|---|---|---|---|---|
| COMPARATIVE EXAMPLES | 18 | SECOND EMBODIMENT | A | 743 CYCLES HUGE WIRING STRUCTURE PORTION VIA OPEN | NG |
| EXAMPLES | 19 | SECOND EMBODIMENT | B | 1013 CYCLES HUGE WIRING STRUCTURE PORTION VIA OPEN | PASS |
| | 20 | SECOND EMBODIMENT | C | 1053 CYCLES HUGE WIRING STRUCTURE PORTION VIA OPEN | PASS |
| | 21 | SECOND EMBODIMENT | D | 1237 CYCLES HUGE WIRING STRUCTURE PORTION VIA OPEN | PASS |
| | 22 | SECOND EMBODIMENT | E | 1435 CYCLES HUGE WIRING STRUCTURE PORTION VIA OPEN | PASS |
| | 23 | SECOND EMBODIMENT | F | 1522 CYCLES FLIP CHIP CONNECTION SOLDER OPEN | PASS |
| | 24 | SECOND EMBODIMENT | G | 1462 CYCLES FLIP CHIP CONNECTION SOLDER OPEN | PASS |
| | 25 | SECOND EMBODIMENT | H | 1037 CYCLES FLIP CHIP CONNECTION SOLDER OPEN | PASS |
| COMPARATIVE EXAMPLES | 26 | SECOND EMBODIMENT | I | 878 CYCLES FLIP CHIP CONNECTION SOLDER OPEN | NG |
| | 27 | SECOND EMBODIMENT | J | 763 CYCLES FLIP CHIP CONNECTION SOLDER OPEN | NG |
| | 28 | SECOND EMBODIMENT | K | 598 CYCLES MINUTE WIRING STRUCTURE PORTION/HUGE WIRING STRUCTURE PORTION INTERFACE EXFOLIATION | NG |

As shown from Table 1 to Table 3, the semiconductor devices No. 5 to No. 14 and No. 19 to No. 25 correspond to the examples of the present invention, and the semiconductor devices No. 1 to No. 4, No. 15 to No. 18 and No. 26 to No. 28 correspond to comparative examples of the present invention. In the case of the same construction as the semiconductor device of the first embodiment, the semiconductor devices of the examples No. 5 to No. 14 in which the elastic modulus at 25° C. of the insulating layer 14 of the huge wiring portion 13b is set in a range from 0.15 to 3.0 GPa succeeded in the temperature cycle test. Furthermore, in the same construction as the semiconductor devices of the second embodiment of the present invention, the semiconductor devices of the examples No. 19 to No. 25 in which the elastic modulus at 25° C. of the insulating layer 16 of the huge wiring structure portion 33 is set in the range from 0.15 to 3.0 GPa succeeded in the temperature cycle test.

What is claimed is:

1. A semiconductor device comprising:
    a semiconductor substrate;
    a minute wiring structure portion provided on said semiconductor substrate and including one or more first wiring layers and one or more first insulating layers, in which each of said first wiring layers and each of said first insulating layers are alternately laminated, and each of said first wiring layers has one or more first wires and a first insulating film for insulating said first wire;
    a first huge wiring structure portion provided on said minute wiring structure portion and including one or more second wiring layers and one or more second insulating layers, in which each of said second wiring layers and each of said second insulating layers are alternately laminated, each of said second wiring layers has a thickness which is twice or more the thickness of said first wiring layer and has one or more second wires and a second insulating film for insulating said second wire, and each of said second insulating layers is thicker than said first insulating layer; and
    a second huge wiring structure portion provided on said first huge wiring structure portion and including one or more third wiring layers and one or more third insulating layers, in which each of said third wiring layers and each of said third insulating layers are alternately laminated, each of said third wiring layers has a thickness which is twice or more the thickness of said first wiring layer and has one or more third wires and a third insulating film for insulating said third wires, and each of said third insulating layers is thicker than said first insulating layer and has the elastic modulus at 25° C. not more than the elastic modulus at 25° C. of the second insulating layer, wherein the elastic modulus at 25° C. of the third insulating layers is set to 0.15 to 3 GPa.

2. The semiconductor device according to claim 1, wherein the elastic modulus at 25° C. of said second insulating layers is smaller than the elastic modulus of at 25° C said first insulating layers.

3. The semiconductor device according to claim 1, wherein the tensile elongation of said third insulating layers is set to 15% or more.

4. The semiconductor device according to claim 1, wherein said second insulating layers and said third insulating layers are formed of the same material.

5. The semiconductor device according to claim 1, wherein said second wires are formed of at least one kind of metal or alloy selected from the group consisting of copper, aluminum, nickel, gold and silver.

6. The semiconductor device according to claim 1, wherein one or more external terminals that are electrically connected to said third wires are provided on said second huge wiring structure portion.

7. The semiconductor device according to claim 6, wherein said surfaces of the external terminals are formed of at least one kind of metal or alloy selected from the group consisting of copper, aluminum, gold, silver and soldering material.

8. The semiconductor device according to claim 1, wherein each of said first wiring layer, said second wiring layer and said third wiring layer has a plurality of power source system wires, and one wire of said power source system wires of said third wiring layer or said second wiring layer is electrically connected to two or more power source system wires of said power source system wires of said first wiring layer.

9. The semiconductor device according to claim 8, wherein one wire of said power source system wires of said third wiring layer is electrically connected to two or more power source system wires of said plural power source system wires of said second wiring layer.

10. The semiconductor device according to claim 1, wherein each of said first wiring layer, the second wiring layer and the third wiring layer has a plurality of ground system wires, and one wire of said ground system wires of said third wiring layer or said second wiring layer is electrically connected to two or more ground system wires of said ground system wires of said first wiring layer.

11. The semiconductor device according to claim 10, wherein one wire of the plural ground system wires of said third wiring layer is electrically connected to two or more ground system wires of said ground system wires of said second wiring layer.

12. The semiconductor device according to claim 1, wherein each of said first wiring layer, said second wiring layer and said third wiring layer has a plurality of power source system wires and a plurality of ground system wires, one wire of said power source system wires of said third wiring layer or said second wiring layer is electrically connected to two or more power source system wires of said power source system wires of said first wiring layer, and one wire of said ground system wires of said third wiring layer or said second wiring layer is electrically connected to two or more ground system wires of said ground system wires of said first wiring layer.

13. The semiconductor device according to claim 12, wherein one wire of said power source system wires of said third wiring layer is electrically connected to two or more power source system wires of said power source system wires of said second wiring layer, and one wire of said ground system wires of said third wiring layer is electrically connected to two or more ground system wires of said ground system wires of said second wiring layer.

14. A semiconductor device comprising:
    a semiconductor substrate;
    a minute wiring structure portion provided on said semiconductor substrate and including one or more first wiring layers and one or more first insulating layers, in which each of said first wiring layers and each of said first insulating layers are alternately laminated, and each of said first wiring layers has one or more first wires and a first insulating film for insulating said first wire;

a first huge wiring structure portion provided on said minute wiring structure portion and including one or more second wiring layers and one or more second insulating layers, in which each of said second wiring layers and each of said second insulating layers are alternately laminated, each of said second wiring layers has a thickness which is twice or more the thickness of said first wiring layer and has one or more second wires and a second insulating film for insulating said second wire, and each of said second insulating layers is thicker than said first insulating layer; and wherein the elastic modulus at 25° C. of said second insulating layers is smaller than the elastic modulus of at 25° C. said first insulating layers.

15. The semiconductor device according to claim 14, wherein the tensile elongation of said third insulating layers is set to 15% or more.

16. The semiconductor device according to claim 14, wherein said second insulating layers and said third insulating layers are formed of the same material.

17. The semiconductor device according to claim 14, wherein said second wires are formed of at least one kind of metal or alloy selected from the group consisting of copper, aluminum, nickel, gold and silver.

18. The semiconductor device according to claim 14, wherein one or more external terminals that are electrically connected to said third wires are provided on said second huge wiring structure portion.

19. The semiconductor device according to claim 18, wherein said surfaces of the external terminals are formed of at least one kind of metal or alloy selected from the group consisting of copper, aluminum, gold, silver and soldering material.

20. The semiconductor device according to claim 14, wherein each of said first wiring layer, said second wiring layer and said third wiring layer has a plurality of power source system wires, and one wire of said power source system wires of said third wiring layer or said second wiring layer is electrically connected to two or more power source system wires of said power source system wires of said first wiring layer.

21. The semiconductor device according to claim 20, wherein one wire of said power source system wires of said third wiring layer is electrically connected to two or more power source system wires of said plural power source system wires of said second wiring layer.

22. The semiconductor device according to claim 14, wherein each of said first wiring layer, the second wiring layer and the third wiring layer has a plurality of ground system wires, and one wire of said ground system wires of said third wiring layer or said second wiring layer is electrically connected to two or more ground system wires of said ground system wires of said first wiring layer.

23. The semiconductor device according to claim 22, wherein one wire of the plural ground system wires of said third wiring layer is electrically connected to two or more ground system wires of said ground system wires of said second wiring layer.

24. A semiconductor device comprising:

a semiconductor substrate;

a minute wiring structure portion provided on said semiconductor substrate and including one or more first wiring layers and one or more first insulating layers, in which each of said first wiring layers and each of said first insulating layers are alternately laminated, and each of said first wiring layers has one or more first wires and a first insulating film for insulating said first wire;

a first huge wiring structure portion provided on said minute wiring structure portion and including one or more second wiring layers and one or more second insulating layers, in which each of said second wiring layers and each of said second insulating layers are alternately laminated, each of said second wiring layers has a thickness which is twice or more the thickness of said first wiring layer and has one or more second wires and a second insulating film for insulating said second wire, and each of said second insulating layers is thicker than said first insulating layer; and a second huge wiring structure portion provided on said first huge wiring structure portion and including one or more third wiring layers and one or more third insulating layers, in which each of said third wiring layers and each of said third insulating layers are alternately laminated, each of said third wiring layers has a thickness which is twice or more the thickness of said first wiring layer and has one or more third wires and a third insulating film for insulating said third wires, and each of said third insulating layers is thicker than said first insulating layer and has the elastic modulus at 25° C. not more than the elastic modulus at 25° C. of the second insulating layer, wherein each of said first wiring layer, said second wiring layer and said third wiring layer has a plurality of power source system wires and a plurality of ground system wires, one wire of said power source system wires of said third wiring layer or said second wiring layer is electrically connected to two or more power source system wires of said power source system wires of said first wiring layer, and one wire of said ground system wires of said third wiring layer or said second wiring layer is electrically connected to two or more ground system wires of said ground system wires of said first wiring layer.

25. The semiconductor device according to claim 24, wherein the tensile elongation of said third insulating layers is set to 15% or more.

26. The semiconductor device according to claim 24, wherein said second insulating layers and said third insulating layers are formed of the same material.

27. The semiconductor device according to claim 24, wherein said second wires are formed of at least one kind of metal or alloy selected from the group consisting of copper, aluminum, nickel, gold and silver.

28. The semiconductor device according to claim 24, wherein one or more external terminals that are electrically connected to said third wires are provided on said second huge wiring structure portion.

29. The semiconductor device according to claim 28, wherein said surfaces of the external terminals are formed of at least one kind of metal or alloy selected from the group consisting of copper, aluminum, gold, silver and soldering material.

30. The semiconductor device according to claim 24, wherein each of said first wiring layer, said second wiring layer and said third wiring layer has a plurality of power source system wires, and one wire of said power source system wires of said third wiring layer or said second wiring layer is electrically connected to two or more power source system wires of said power source system wires of said first wiring layer.

31. The semiconductor device according to claim 30, wherein one wire of said power source system wires of said third wiring layer is electrically connected to two or more power source system wires of said plural power source system wires of said second wiring layer.

32. The semiconductor device according to claim 24, wherein each of said first wiring layer, the second wiring layer and the third wiring layer has a plurality of ground system wires, and one wire of said ground system wires of said third wiring layer or said second wiring layer is electrically connected to two or more ground system wires of said ground system wires of said first wiring layer.

33. The semiconductor device according to claim 32, wherein one wire of the plural ground system wires of said third wiring layer is electrically connected to two or more ground system wires of said ground system wires of said second wiring layer.

34. The semiconductor device according to claim 24, wherein one wire of said power source system wires of said third wiring layer is electrically connected to two or more power source system wires of said power source system wires of said second wiring layer, and one wire of said ground system wires of said third wiring layer is electrically connected to two or more ground system wires of said ground system wires of said second wiring layer.

* * * * *